(12) United States Patent
Chatterjee et al.

(10) Patent No.: US 6,598,214 B2
(45) Date of Patent: Jul. 22, 2003

(54) DESIGN METHOD AND SYSTEM FOR PROVIDING TRANSISTORS WITH VARYING ACTIVE REGION LENGTHS

(75) Inventors: Amitava Chatterjee, Plano, TX (US); Sreedhar Natarajan, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 91 days.

(21) Appl. No.: 10/001,343

(22) Filed: Oct. 25, 2001

(65) Prior Publication Data

US 2002/0083399 A1 Jun. 27, 2002

Related U.S. Application Data

(60) Provisional application No. 60/257,466, filed on Dec. 21, 2000.

(51) Int. Cl.[7] ............................................. G06F 17/50
(52) U.S. Cl. ............................... 716/10; 716/9; 716/2
(58) Field of Search .................................. 716/10, 9, 2

(56) References Cited

U.S. PATENT DOCUMENTS

| | | | | | |
|---|---|---|---|---|---|
| 5,247,456 | A | * | 9/1993 | Ohe et al. ........................ | 716/9 |
| 5,446,674 | A | * | 8/1995 | Ikeda et al. ..................... | 716/5 |
| 5,598,347 | A | * | 1/1997 | Iwasaki ........................... | 716/8 |
| 5,612,893 | A | * | 3/1997 | Hao et al. ....................... | 716/2 |
| 5,631,841 | A | * | 5/1997 | Kishida et al. ................. | 716/14 |
| 5,663,076 | A | * | 9/1997 | Rostoker et al. ............... | 438/14 |
| 6,185,706 | B1 | * | 2/2001 | Sugasawara ................. | 714/724 |
| 6,453,447 | B1 | * | 9/2002 | Gardner et al. ................. | 716/3 |
| 6,490,709 | B1 | * | 12/2002 | Kimura et al. .................. | 716/5 |
| 2002/0073388 | A1 | * | 6/2002 | Orshansky et al. ............. | 716/5 |
| 2002/0073394 | A1 | * | 6/2002 | Milor et al. ..................... | 716/19 |

FOREIGN PATENT DOCUMENTS

| | | | | |
|---|---|---|---|---|
| JP | 59090958 A | * | 5/1984 | ............ H01L/29/78 |
| JP | 60037158 A | * | 2/1985 | ............ H01L/27/08 |
| JP | 60037159 A | * | 2/1985 | ............ H01L/27/08 |
| JP | 11312802 A | * | 11/1999 | ............ H01L/29/78 |

OTHER PUBLICATIONS

Mehrotra et al., "Skew and delay minimization of high speed CMOS circuits using stochastic optimization", Proceedings of the IEEE 1994 Custom Integrated Circuits Conference, May 1, 1994, pp. 245–248.*

(List continued on next page.)

Primary Examiner—Matthew Smith
Assistant Examiner—Phallaka Kik
(74) Attorney, Agent, or Firm—Peter K. McLarty; W. James Brady, III; Frederick J. Telecky, Jr.

(57) ABSTRACT

A method (40) of designing a circuit comprising a plurality of transistors ($10$, $46_T$, $60_T$). Each transistor of the plurality of transistors comprises an active region, a gate ($G_1$, $G_2$), a first source/drain ($S/D_1$, $S/D_3$) in the active region, a second source/drain in the active region, and at least one contact in each of the first source/drain and the second source/drain. The method comprises various steps. The method specifies a first set of distances for each transistor in a first set (10) of transistors in the plurality of transistors, wherein the first set of distances comprises a gate length ($L_g$), a gate width ($W_g$), and a distance representative of one or both of a first contact-to-edge distance ($CTE_1$) and a first contact-to-gate distance ($CTG_1$). The method also specifies (46) a second set of distances for each transistor in a second set ($46_T$, $60_T$) of transistors in the plurality of transistors, wherein the second set of distances comprises a gate length ($L_g$), a gate width ($W_g$), and a distance representative of one or both of a second contact-to-edge distance ($CTE_2$) and a second contact-to-gate distance ($CTG_2$). For the method specifications, either or both the second contact-to-edge distance is greater than the first contact-to-edge distance and the second contact-to-gate distance is greater than the first contact-to-gate distance. Also for the method specifications, for each transistor in the second set of transistors, the step of specifying a second set of distances is responsive to a determination (44, 48) of a benefit from a larger drive current to be provided by the transistor in the second set of transistors.

28 Claims, 3 Drawing Sheets

OTHER PUBLICATIONS

Wang et al., "Circuit driven delay optimization of EMODL carry lookahead adders", 1994 Conference Record of the Twenty–Eigth Asilomar Conference on Signals, Systems and Computers, vol. 1, Oct. 31, 1994, pp. 550–554.*

Cong et al., "An efficient approach to simultaneous transistor and interconnect sizing", 1996 IEEE/ACM International Conference on Computer–Aided Design, Nov. 10, 1996, pp. 181–186.*

Kao, W. H., "A new block–based design methodology and CAD toolset for mized signal ASIC design", $2^{nd}$ International Conference on ASIC, Oct. 21, 1996, pp. 19–22.*

Betz et al., "Circuit design, transistor sizing and wire layout of FPGA interconnect", Proceedings of the IEEE 1999 Custom Integrated Circuits, May 16, 1999, pp. 171–174.*

Chen et al., "Performance driven cell generator for dynamic CMOS circuits", IEEE International Symposium on Circuits and Systems, vol. 3, May 8, 1989, pp. 1883–1886.*

Lin et al., "Cell height driven transistor sizing in a cell based module design", Proceedings of the European Conference on Design Automation, Feb. 28, 1994, pp. 425–429.*

Gabara et al., "Digital transistor sizing techniques applied to 100K ECL CMOS output buffers", Proceedings of Sixth Annual IEEE International ASIC Conference and Exhibit, Sep. 27, 1993, pp. 456–459.*

Kim et al., "PERFLEX: a performance driven module generator", European Design Automation Conference, Sep. 7, 1992, pp. 154–159.*

* cited by examiner

DESIGN METHOD AND SYSTEM FOR PROVIDING TRANSISTORS WITH VARYING ACTIVE REGION LENGTHS

This application claims priority under 35 USC §119(e)(1) of provisional application No. 60/257,466 filed Dec. 21, 2000.

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to designs for circuits including a number of metal oxide semiconductor ("MOS") transistors and to optimize drive current capability versus area consumption and capacitance load.

Semiconductor devices have become prevalent in all aspects of electronic circuits, and the design of transistors used in such circuits typically takes into account various factors including layout area, power consumption, speed, and the like. Various computer-assisted design systems have arisen and many of these systems attempt to consider and optimize the above factors in developing circuit designs. These systems are able to increase the efficiency of circuit design, and the systems themselves are periodically improved which may therefore also improve the circuit designs resulting from the system. Indeed, the preferred embodiments discussed later form a basis to improve such systems as well as circuit design either by itself or as a result of such an improved computer-assisted design system.

By way of further background, FIG. 1 illustrates a plan view of a prior art transistor 10 in order to establish various terminology and related aspects to be used throughout this document. Transistor 10 is typically formed in connection with an underlying semiconductor substrate, although such a substrate is not visible from the plan perspective in FIG. 1. A semiconductor active region is defined relative to the substrate, such as by forming isolating regions $12_1$, and $12_2$, thereby defining the active region as the semiconductor area accessible at the upper semiconductor surface and between the isolating regions. Isolating regions $12_1$ and $12_2$ may be formed using shallow trench isolation ("STI") or other isolating techniques (e.g., field oxides), and while shown in FIG. 1 as separate regions they also may be a continuous region all around the perimeter of the active region. A gate $G_1$ is formed, typically by patterning and etching a formed layer of polycrystalline silicon ("polysilicon") that is formed over the semiconductor substrate. In effect, gate $G_1$ separates the active region into two areas generally to the sides of gate $G_1$ and in which the source and drain of transistor 10 are formed. In many transistor configurations, the source and drain are physically alike and symmetric. Further, they also may be electrically connected so that for different instances current flow changes directions. Thus, for sake of general reference and unless specified otherwise, each such region is referred to as a source/drain in FIG. 1 and there is a source/drain $S/D_1$ and a source/drain $S/D_2$. Typically, source/drains $S/D_1$ and $S/D_2$ are formed by implanting dopants adjacent both edges of gate $G_1$ and into the active region (where the active region may include one or more wells previously formed within the substrate). For example, for an n-type MOS transistor ("NMOS"), each source/drain $S/D_1$ and $S/D_2$ is formed by one or more implanting steps that implant n-type dopants, where these dopants are often self-aligned to gate $G_1$ (and possibly to insulating sidewalls formed along gate $G_1$, although such sidewalls are not shown to simplify the Figure and discussion). For each source/drain $S/D_1$ and $S/D_2$, a number of contacts are formed so that electrical access may be made to the respective source/drain. By way of reference and example in FIG. 1, these contacts are $C_1$ through $C_4$ with respect to source/drain $S/D_1$, and these contacts are $C_5$ through $C_8$ with respect to source/drain $S/D_2$. The techniques for forming contacts $C_1$ through $C_8$ may take various forms. Finally, note that gate $G_1$ includes an electrical contact pad $CP_1$ formed by extending the conductive gate material beyond the perimeter of the active region.

FIG. 1 further defines various dimensions which are noteworthy in prior art circuit design. First, in the dimension that gate $G_1$ separates the active region into source/drains $S/D_1$ and $S/D_2$, and to the extent that gate $G_1$ overlies the active region (i.e., as shown vertically in FIG. 1), is the width of gate $G_1$, designated $W_g$. Note that gate $G_1$ may extend beyond the active region such as shown in FIG. 1 in the vertical dimension, but the gate width $W_g$ is defined only where the gate overlies the active region. Second, in the dimension that gate $G_1$ is perpendicular to $W_g$ is the length of gate $G_1$, designated $L_g$. Often, $L_g$ and $W_g$ are established by a circuit designer, either manually or by a computer-assisted technique such as with a special design program used to develop transistor inclusive circuits. Moreover, as technology advances, the gate length $L_g$ commonly decreases, and often there is a corresponding decrease in $W_g$. Indeed, in some contemporary circuits, a so-called set of design rules are established and which sets minimum limits to certain critical dimensions. Each transistor in the circuit is constructed such that these design rules are not violated by a dimension falling below any of the minimum limits. For example, under contemporary designs a typical set of design rules may dictate a minimum value of $L_g=0.11$ μm and that for $W_g=0.15$ μm.

FIG. 1 introduces two additional distances by way of further background to the preferred embodiment. Specifically, within each source/drain, each contact $C_1$ through $C_8$ is located in a position relative to gate $G_1$ and relative to the outer perimeter, or edge, of the active region. The location of each such contact is also dictated by two distances, which are shown by way of example with respect to contact $C_2$. Specifically, a distance $CTE_1$ is shown as the contact-to-edge distance with respect to contact $C_2$, that is, the distance between contact $C_2$ and the edge of the active region. Additionally, a distance $CTG_1$ is shown as the contact-to-gate distance with respect to contact $C_2$, that is the distance between contact $C_2$ and gate $G_1$. Having illustrated these two distances, various observations may be made about them as relating to the typical implementation of the distances in the prior art. First, for a given source/drain (e.g., source/drain $S/D_1$), the distances are the same for each contact. Thus, by way of example in FIG. 1, the same distances $CTE_1$ and $CTG_1$ apply to contacts $C_1$ through $C_4$. Second, in many configurations, the distances $CTE_1$ and $CTG_1$ apply to all contacts for both source/drains of the transistor. For example, under contemporary designs a typical set of design rule minimum values is $CTE_1=0.05$ μm and $CTG_1=0.095$ μm. Further, from these distances it is noted that FIG. 1 is not drawn to scale, but it is drawn in a manner to provide a relative basis for comparison to later Figures as will be appreciated below. Alternatively, for transistors not implementing the minimums in the design rules, they may implement a second set of distances with larger values for the contact-to-edge and contact-to-gate distances, along with corresponding larger values for $L_g$ and $W_g$. Still further, note that often the limit for one critical dimension may be dependent on the value of another dimension. For example, the minimum from above of $CTG_1=0.095$ μm may apply where $L_g \leq 0.4$ μm while for $L_g > 0.4$ μm then the minimum value for $CTG_1$ may be $CTG_1=0.125$ μm. Generally, a transistor constructed according to the minimum dimensions allowed by the design rules consumes a lesser amount of integrated circuit area as compared to a transistor drawn using larger dimensions. Moreover, because minimizing area is often a key design goal, then typically most of the transistors in a circuit are constructed according to the minimum size allowed by the design rules, with the exception of $W_g$ and $L_g$. The dimensions $W_g$ and $L_g$ for each transistor may be individually adjusted by the designer, either manually or with computer-assisted design systems to obtain a desired electrical behavior for a circuit.

While the preceding sets of rules and observations have proven useful in circuit design, the present inventors have observed various limitations and possible drawbacks to prior approaches. As the minimum dimensions allowed by the design rules have advanced and thereby dictated shorter distances, it has been observed that various operational limits may be imposed on certain transistors. As a particular example relevant to the preferred embodiments described later, it has been observed that as CTG is reduced to the minimum allowed by the design rules, the drive current in a p-type MOS transistor ("PMOS") increases monotonically. However, it has been observed further than an NMOS transistor provides a lower amount of drive current as CTG is reduced below a certain value larger than the minimum allowed by the design rules. Thus, in connection with the preferred embodiments described below it is further observed in this case that there is an optimum value of CTG for which the drive current is maximized. Moreover, various hypotheses are suggested by the present inventors with respect to the cause(s) for this reduced drive current from the NMOS transistor, as described below.

As a first possible reason for the reduced drive current in an NMOS transistor implementing the minimums set by the design rules, those rules may impose significant stress on the NMOS transistor which therefore affects electron mobility. More particularly, the stress is believed to affect the effective mass in the valence and conduction bands of the crystalline structure and, indeed, more notably in the valence band. The effect reduces the electron mobility in the conduction band and, hence, reduces the drive current of an NMOS transistor constructed under the minimum CTG allowed by the design rules.

A second possible reason for the reduced drive current in an NMOS transistor under the minimum CTG distance allowed by the design rules relates to the formation of silicides over the source/drain regions of transistor 10. Particularly, while not shown in FIG. 1, it is known in the art that a low-resistance conductor is typically formed over each source/drain region so that electrical contact can be made to that conductor and, hence, to the underlying source/drain. Indeed, contacts $C_1$ through $C_8$ should be understood to contact these types of low resistance conductors. Often, the low-resistance conductor is a silicide formed over the underlying silicon portion of the source/drain. In this case, an interface exists between the silicide and the silicon source/drain, thereby presenting an electrical resistance along that interface. Given this interface resistance, it is known in the art that a so-called contact transfer length may be defined which defines a characteristic distance over which the current is transferred across the interface between the silicide and the silicon. To further address this aspect as well as the preferred embodiments described later, then the length of the silicided region that is perpendicular to the longer axis of the gate, and where this length is also therefore the length of the underlying active region in the same dimension, is hereafter referred to as $L_s$. Thus, given a particular transfer length, then a length of $L_s$ that is substantially shorter than the contact transfer length may effectively cramp the flow of current. Consequently, when the design rules result in the use of a length of silicide region that is substantially smaller than the contact transfer length, then such an implementation also may affect (and limit) the amount of drive current in an NMOS transistor. Of course, by increasing $L_s$ excessively a penalty is incurred in area with diminishing returns for lower series resistance.

Regardless of the actual cause of reduced NMOS drive current under the minimum design rules, the present inventors note that the result of limited current flow is ignored in the art and instead there is an indiscriminate use of the minimum dimensions in the design rules in an effort to reduce the area required by transistors on an integrated circuit. Such usage, therefore, may be perceived to increase device efficiency by reducing device size, but at the same time a cost, which may not be intentional, arises in that any NMOS transistors using the minimums set forth by the design rules may be underperforming in terms of current flow. As a result, such devices may slow the operation of the integrated circuit which may in some instances be very undesirable. In view of these observations, the preferred embodiments attempt to improve upon these attributes as appreciated from the remaining discussion below.

BRIEF SUMMARY OF THE INVENTION

In one preferred embodiment, there is a method of designing a circuit comprising a plurality of transistors. Each transistor of the plurality of transistors comprises an active region, a gate, a first source/drain in the active region, a second source/drain in the active region, and at least one contact in each of the first source/drain and the second source/drain. The method comprises various steps. The method specifies a first set of distances for each transistor in a first set of transistors in the plurality of transistors, wherein the first set of distances comprises a gate length, a gate width, and a distance representative of one or both of a first contact-to-edge distance and a first contact-to-gate distance. The method also specifies a second set of distances for each transistor in a second set of transistors in the plurality of transistors, wherein the second set of distances comprises a gate length, a gate width, and a distance representative of one or both of a second contact-to-edge distance and a second contact-to-gate distance. For the method specifications, either or both the second contact-to-edge distance is greater than the first contact-to-edge distance and the second contact-to-gate distance is greater than the first contact-to-gate distance. Also for the method specifications, for each transistor in the second set of transistors, the step of specifying a second set of distances is responsive to a determination of a benefit from a larger drive current to be provided by the transistor in the second set of transistors. Other circuits, systems, and methods are also disclosed and/or claimed.

DETAILED DESCRIPTION OF THE INVENTION

Figure 1:
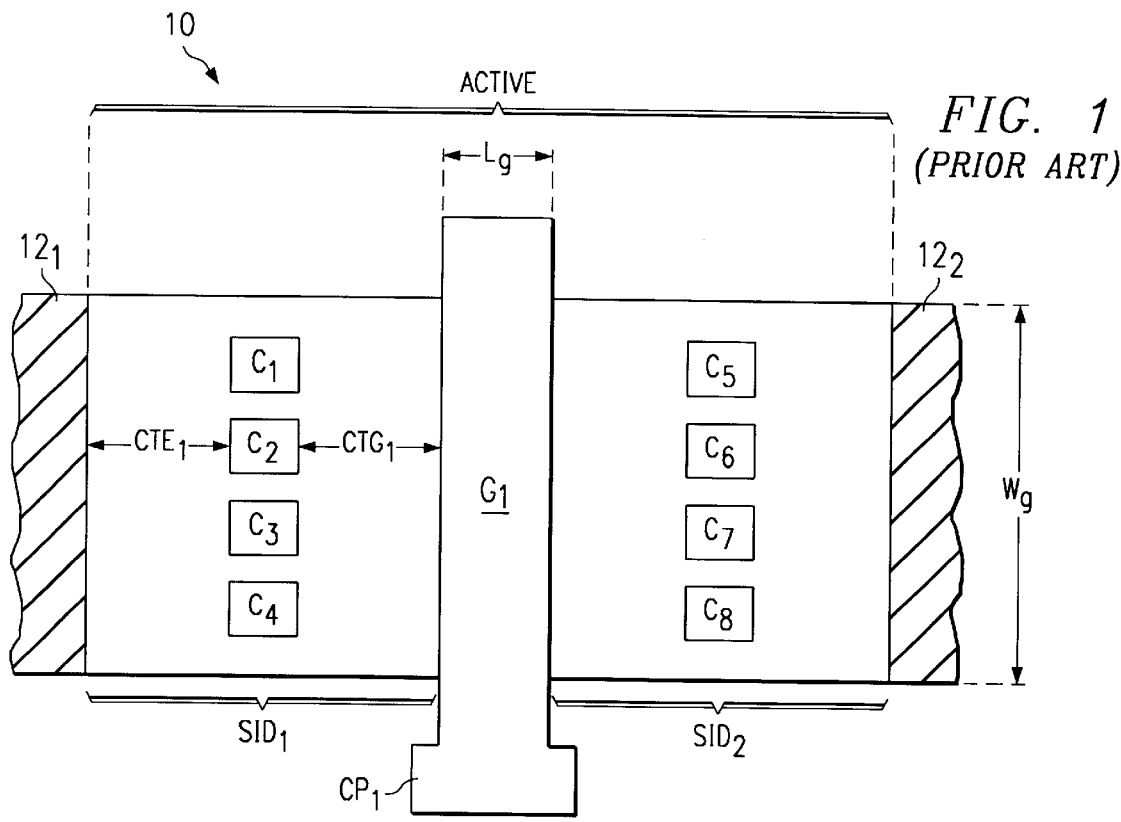
FIG. 1 illustrates a plan view of a prior art transistor.

FIG. 1 was discussed in the preceding Background Of The Invention section of this document and the reader is assumed familiar with the principles in that discussion.

Figure 2:
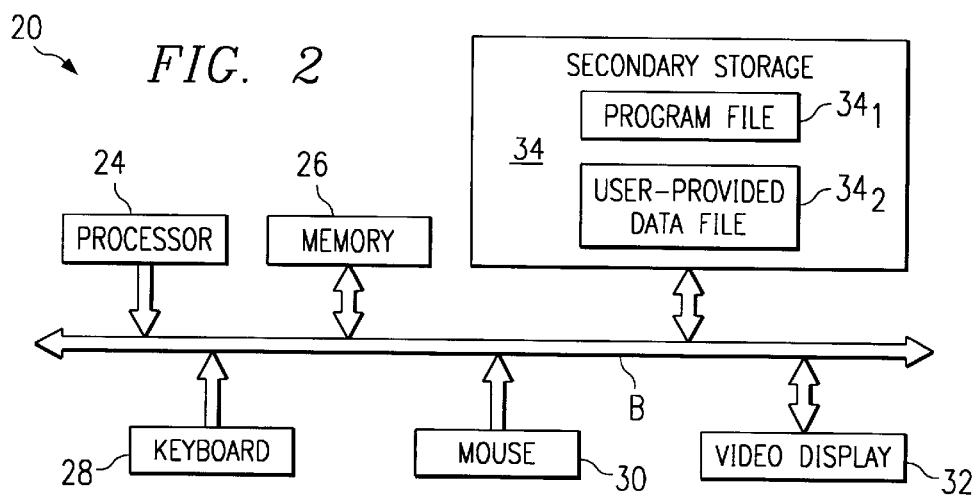
FIG. 2 illustrates a preferred embodiment computer system for designing a circuit including a number of transistors.

The preferred embodiment includes a methodology for imposing certain criteria in the design of transistor circuits and may be implemented in one preferred approach by way of a computer system 20 as shown in block diagram form in FIG. 2. System 20 embodies a computer which may be of various types such as a personal computer ("PC"), a workstation, or other processing devices operable to perform the preferred functionality described in this document. System 20 includes a processor 24 (e.g., CPU, or other single or multiple processors) having access via a bus B to a memory 26, where memory 26 may be one or more memories capable of storing various types of data. System 20 further includes one or more input/output devices, as may be selected by one skilled in the art. By way of example, such devices in FIG. 2 include a keyboard 28, a mouse 30, and a video display 32, each operable as known in the art. Of course, other input/output devices also may be added to system 20 (e.g., scanner, touch pad, digitizer pad, printer, and so forth).

System 20 further includes a secondary storage block 34, where block 34 may include various peripherals ascertainable by one skilled in the art for providing data; such peripherals may include, by way of example, a floppy disk drive, a hard disk drive, a CD ROM drive, an optical drive, and so forth. In the preferred embodiment, one or more of these peripheral devices stores a program file $34_1$, and a user-provided data file $34_2$, where information from these files may be loaded into memory 26 or other accessible memories (e.g., within processor 24) in order to program the computer of system 20 to perform various circuit design operations as detailed later. Both files $34_1$ and $34_2$ may be created by various forms according to principles known to one skilled in the art. For example, various program languages may be used for program file $34_1$. As another example, various input and model techniques may be used for user-provided data file $34_2$, such as a leaf-cell data including a netlist of circuit components such as transistors, resistors, capacitors, inductors, and also including device connections, signals, and possibly behavioral reference files.

Figure 3:
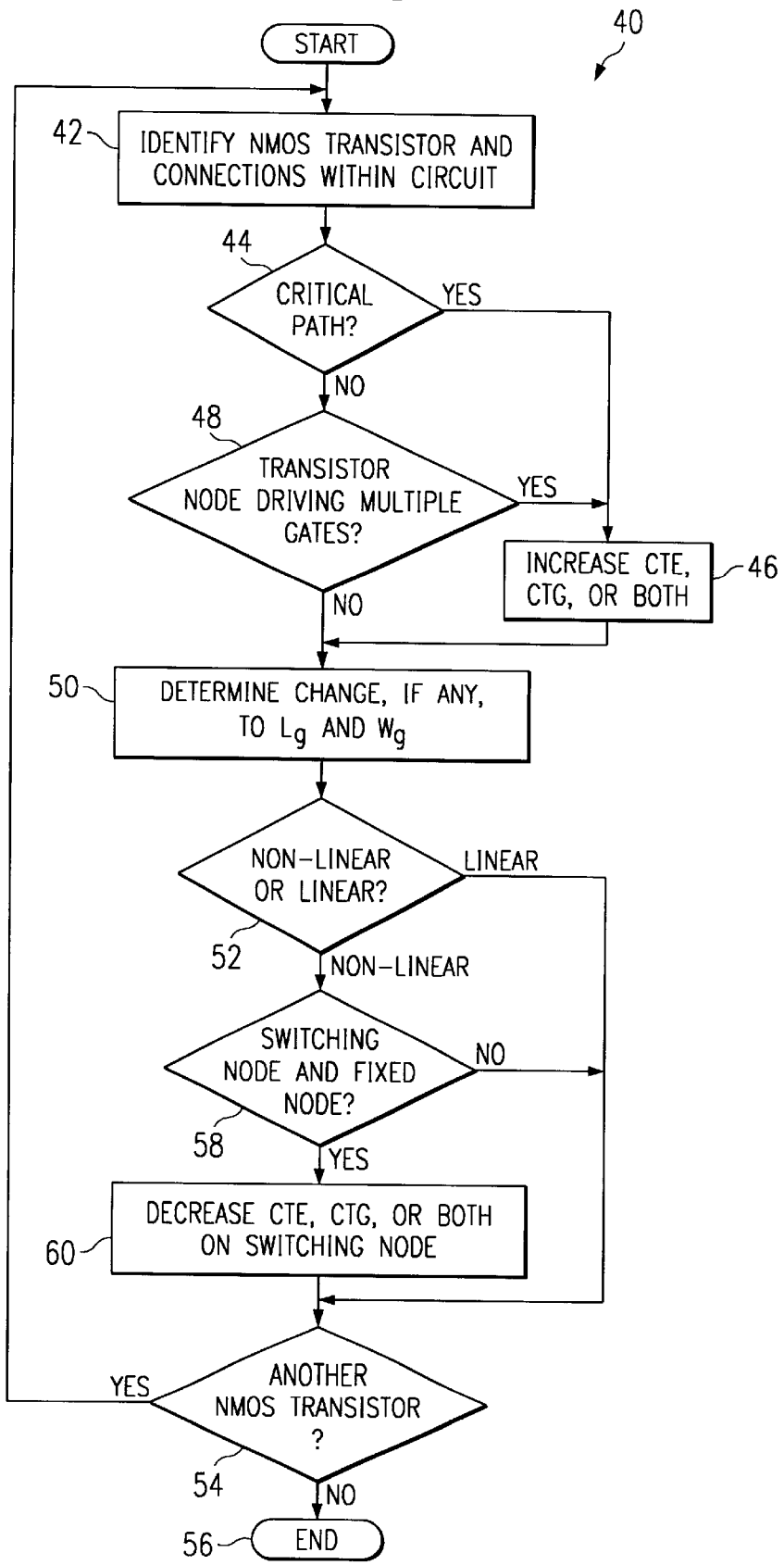
FIG. 3 illustrates a flow chart of a method demonstrating the preferred operation of the computer system in FIG. 2.

The operation of system 20 may occur in a general sense according to principles known in the computer art, and in addition more specifically according to the preferred embodiment so as to design circuits by applying program file $34_1$, to user-provided data file $34_2$. Since general operation is well-known, the remaining discussion focuses on the operation unique to the preferred embodiments. In this regard, FIG. 3 illustrates a flow chart of a method 40 demonstrating the preferred operation of system 20, and it should be understood at the outset that the steps of method 40 are preferably achieved in response to program data in file $34_1$ and are taken to evaluate criteria and determine design specifications for transistors in data file $34_2$. Also by way of introduction to method 40, note that while it illustrates certain preferred steps in a given order, one skilled in the art should appreciate that the order of such steps may be changed and indeed additional steps may be added and other steps may be removed. Further, method 40 may be readily added to existing methodologies used, by way of example, in computer-assisted circuit design so that the considerations of those existing methodologies may be combined with and thereby further enhanced by the considerations of method 40. In any event, the particular steps of method 40 demonstrate various criteria examined while the above alterations and substitutions give rise to various alternative embodiments under the present inventive scope. These criteria as well as additional considerations are apparent from the remaining discussion.

Method 40 begins with a step 42, where system 20 identifies an NMOS transistor and its connections within the circuit being designed. Thus, step 42 evaluates data in file $34_2$ to determine factors such as the signals (including voltages) to be coupled to the nodes of the identified NMOS transistor including any device connection(s) proving an input to the transistor or any connection(s) to which the transistor provides an output. Next, method 40 continues from step 42 to step 44.

Step 44 determines whether the NMOS transistor identified in step 40 is located in the critical path of the circuit being designed. In this regard, it is anticipated that system 20 is able to determine from input data, or that the input expressly identifies, the critical path of the circuit being designed. Such a path is known in the art to be identifiable by simulating the timing operation of the circuit and locating the sub-circuit or sub-circuits that limit the speed of the circuit. In other words, one or more locations in the circuit may be identified as a bottleneck in the data path of the circuit such that if the speed at this bottleneck is improved then overall data throughput speed is also improved. To the contrary, often circuits may have non-critical path areas on the circuit, that is, in such areas where even if speed is improved in that area then the overall data path speed of the circuit is not improved. In any event, if step 42 determines that the identified NMOS transistor is in the critical path, then method 40 proceeds from step 44 to step 46, whereas if the identified transistor is not in the critical path, then method 40 proceeds from step 44 to step 48.

Figure 4:
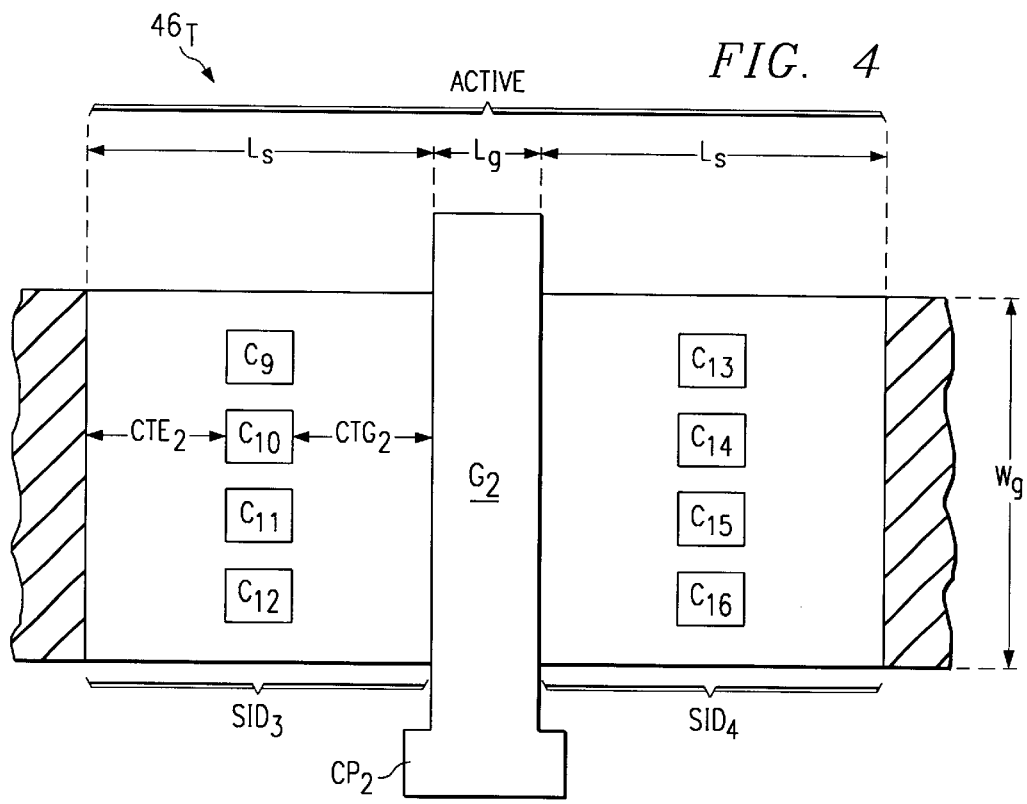
FIG. 4 illustrates a transistor having an active region length that is enlarged relative to the minimums set forth in the design rules according to the preferred embodiment.

When step 46 is reached from step 44, or from step 48 as detailed below, method 40 increases the total distance related to the sum of the contact-to-edge distance and the contact-to-gate distance; thus, the increase is in the parameter introduced previously as $L_s$, and which is now illustrated further with reference to FIG. 4. Specifically, FIG. 4 illustrates a transistor $46_T$, designated as such to relate it to step 46 in method 40. Transistor $46_T$ shares some attributes with transistor 10 illustrated in and discussed above relative to FIG. 1, although different reference identifiers are used so as to distinguish the discussion of each device and also to facilitate a discussion of the device differences. In general, transistor $46_T$ includes a gate $G_2$ separating an active region into two source/drains $S/D_3$ and $S/D_4$, where each source/drain is contacted by a set of four contacts $C_9$ through $C_{12}$ and $C_{13}$ through $C_{16}$, respectively. For transistor $46_T$, its contact-to-edge and contact-to-gate distances are indicated as $CTE_2$ and $CTG_2$, respectively, and are shown by example with respect to contact $C_{10}$ while it is intended for this embodiment that the same distances apply for all other contacts of transistor $46_T$. Importantly, and as a result of step 46, one or both of the values $CTE_2$ and $CTG_2$ are made greater than $CTE_1$ and $CTG_1$, respectively. In other words, the total length $L_s$, along the active region for transistor $46_T$ (i.e., in the dimension perpendicular to the longer axis of gate $G_2$) is specified by step 46 to be greater than the total comparable length along the active region for transistor 10. However, at this point in the method flow, note that $L_g$ and $W_g$ are unchanged and therefore may remain at the distances specified as the minimums by the design rules, while the total length of the active region is increased.

Before proceeding with additional steps, note the result of step 46. Specifically, as detailed earlier with respect to FIG. 1, as $CTE_1$ and $CTG_1$ are reduced to the minimum dimensions allowed in the applicable design rules, then for an NMOS transistor the amount of drive current provided by that transistor is reduced. However, in the preferred embodiment and as a result of steps 44 and 46, then an NMOS transistor identified to be in the critical path of the circuit being designed is specified to include a larger value for one or both of its contact-to-edge distance or its contact-to-gate distance. Thus, due to the increased distance(s), transistor $46_T$ provides a greater amount of drive current as compared to transistor 10. The increased drive current will tend to improve the speed of the device which is situated along the critical path of the circuit being designed, thereby improving the overall circuit speed. After step 46, method 40 continues to step 50.

Figure 5:
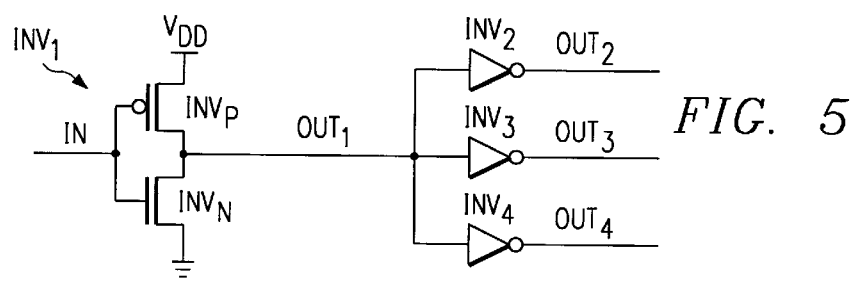
FIG. 5 illustrates a schematic of an inverter.

Returning to the flow of method 40 following step 44, recall that if step 44 does not identify that the NMOS transistor is in the critical path of the circuit being designed then the flow continues to step 48, which is now discussed. Step 48 determines whether one of the nodes of the NMOS transistor identified in the preceding step 42 drives gates of multiple (i.e., two or more) transistors. By way of example, FIG. 5 illustrates a schematic of an inverter $INV_1$ consisting of a p-channel transistor $INV_P$ and an n-channel transistor $INV_N$ connected in a known fashion, that is, with their gates tied and providing to receive an input signal, IN, with their sources connected to respective supply voltages $V_{DD}$ and ground, and with their drains tied and providing an output signal $OUT_1$. By way of example, output signal $OUT_1$ is connected to drive the inputs of three additional inverters, $INV_2$, $INV_3$, and $INV_4$, and for simplification the actual transistors of these additional inverters are not shown but are understood to take the same general form as the pair of transistors in inverter $INV_1$. Thus, the output $OUT_1$ drives the gates of six transistors, namely, the three respective pairs of transistors provided by inverters, $INV_2$, $INV_3$, and $INV_4$. Using this example and returning to step 48, assume that step 42 identifies NMOS transistor $INV_N$ and the present flow of method 40 then reaches step 48. Due to the configuration illustrated in FIG. 5, step 48 makes an affirmative determination because the drain of transistor $INV_N$ indeed drives multiple transistor gates. As a result of the affirmative determination, then method 40 proceeds from step 48 to step 46; in contrast, if a different example or instance were provided wherein step 48 did not detect multiple gates being driven by the identified transistor, then method 40 proceeds from step 48 to step 50.

When step 46 is reached following step 48 as in the preceding example, then step 46 operates in the same manner as described earlier as a result of the satisfaction of the condition of step 44 (i.e., that the NMOS transistor is in a critical path). Thus, likewise for the condition of step 48 (i.e., that the NMOS transistor drives multiple transistor gates), method 40 increases the total distance $L_s$, that is, the sum of the contact-to-edge distance and the contact-to-gate distance as well as the length of the corresponding contact; preferably, the length of the contact is left unchanged because device processing commonly dictates like-dimensions for device contacts; instead, therefore step 46 increases either or both of $CTE_2$ and $CTG_2$ thereby increasing $L_s$. As a result, added drive current capability will be provided by the NMOS transistor to the multiple transistor gates it is driving. Returning then to the example of FIG. 5, the NMOS transistor $INV_N$ will have a relatively greater drive current than if it were designed to implement the minimum design rules. Note by way of contrast that one skilled in the art may previously have increased $W_g$ for an identified transistor that drives multiple other transistor gates. However, such an alternative approach thereby increases the load provided by the identified transistor, which may be undesirable. In contrast, an increase of $L_s$ by the preferred embodiment provides greater drive current without increasing device load in a manner as would a change in $W_g$ alone.

Before proceeding with the discussion of additional steps, one skilled in the art should therefore appreciate that steps 44 and 48 have in common a mutual and more general criterion. Specifically, while step 44 determines whether a particular transistor is in a critical path and step 48 determines whether a particular transistor drives multiple transistor gates, both steps more generally may be observed to be directed to determining whether additional drive current would benefit the NMOS transistor being considered. In other words, in the preferred embodiment both steps 44 and 48 are each a manifestation of a specific circumstance under which additional drive current is beneficial and, hence, in response to determining that such additional current is beneficial, $L_s$ is adjusted appropriately. Indeed, one skilled in the art may ascertain still other specific criteria which more generally relate to the need for increased drive current, with the satisfaction of any of those criteria resulting in a likewise flow to step 46 so that $L_s$ is increased thereby providing a greater drive current for the NMOS transistor.

In step 50, method 40 considers the merit of changing either or both of $L_g$ and $W_g$, and these considerations in various respects may be made according to the same factors examined in the prior art for increasing these distances. However, in accordance with the preferred embodiment, any change to either or both of $L_g$ and $W_g$ further takes into account any change in $L_s$ which may have been designated by step 46 for the same NMOS transistor. Thus, while prior art design methodologies consider only possible changes to $L_g$ and $W_g$, the preferred embodiment adds the consideration of a third dimension which is affected by a change to either or both of the contact-to-edge and/or contact-to-gate distances. Indeed, note that the prior art may increase $W_g$ and $L_g$ in order to achieve an increase in drive current, but such a change may not be necessary under the preferred embodiment since it may instead achieve a higher drive current through a change in either or both of the contact-to-edge and/or contact-to-gate distances. Moreover, any change in $W_g$ and $L_g$ also may cause a related change in some other undesirable factor (e.g., capacitance) and, hence, achieving the higher drive current through a change to either or both of the contact-to-edge and/or contact-to-gate distances may be more desirable in various instances. Following step 50, method 40 continues to step 52.

Step 52 passes the flow of method 40 based on whether the NMOS transistor identified in the preceding step 42 will operate in its linear range or in its non-linear (e.g., digital) range. If the NMOS transistor will operate in its linear range, then method 40 continues from step 52 to step 54. On the other hand, if the NMOS transistor will operate in its non-linear range, then method 40 continues from step 52 to step 58.

In step 54, method 40 determines whether the circuit being analyzed includes another NMOS transistor that has not been processed through the steps described above. If another such NMOS transistor exists, then method 40 returns the flow to step 42 to identify a next NMOS transistor and the flow proceeds with subsequent steps as pertaining to the newly-identified transistor. If no such additional transistor(s) exists, then method 40 concludes with an end step 56.

Looking now to step 58 which is reached if step 52 determines that the identified NMOS transistor will operate in its non-linear region, step 58 examines whether the non-linear operating transistor is connected in a manner such that one of its source/drains is connected to a fixed potential while the other of its source/drains is connected to a switching potential. By way of example and returning to FIG. 5, consider the instance where step 58 is reached with respect to NMOS transistor $INV_N$. At this point, therefore, step 58 would determine that transistor $INV_N$ has a first source/drain connected to a fixed potential (i.e., ground) and a second source/drain connected to a switching potential (i.e., $OUT_1$). Indeed, in some instances because of this connection the first source/drain is referred to as the source while the second source/drain is referred to as the drain. In any event, if step 58 reaches a negative determination, then method 40 continues to step 54 which, as described above, determines whether another transistor exists for analysis; on the other hand, if step 54 reaches a positive determination as in the example of NMOS transistor $INV_N$ of FIG. 5, then method 40 continues from step 58 to step 60.

Figure 6:
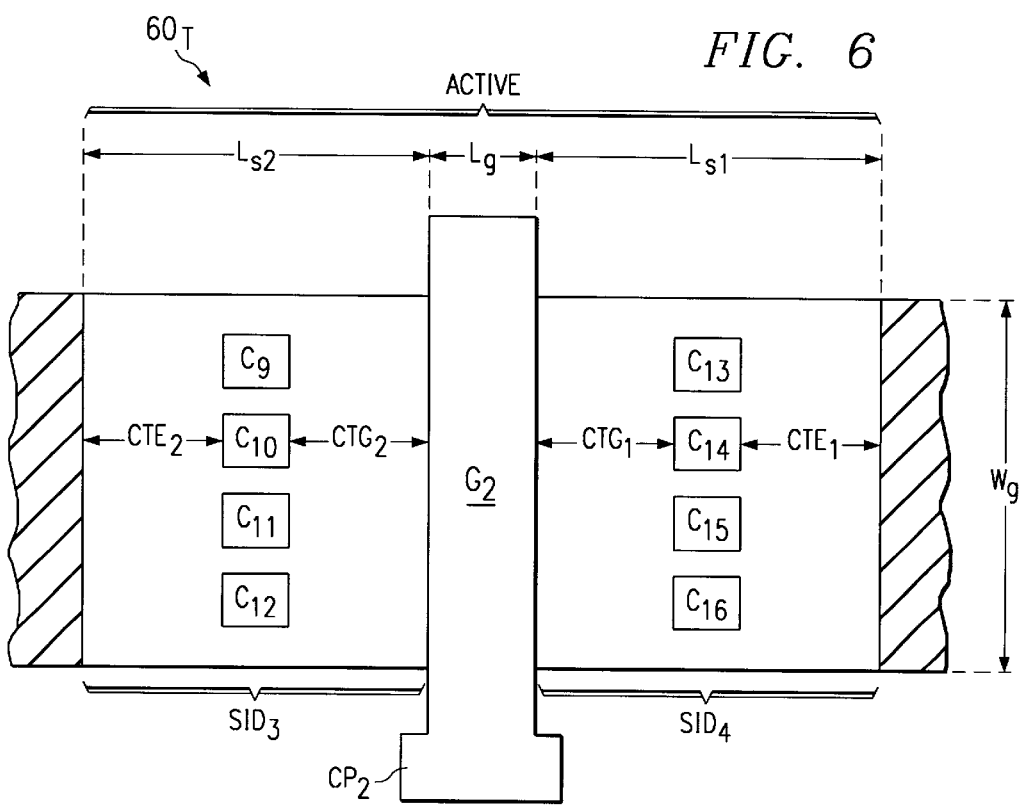
FIG. 6 illustrates a transistor having an active region length that is enlarged relative to the minimums set forth in the design rules, whereby the enlargement affects only one source/drain of the transistor and its other source/drain is dimensioned according to the minimum design rules.

Step 60 decreases the distance $L_s$, assuming it was previously increased by step 46, for only the source/drain which in step 58 was determined to connect to a switching node. Thus, in the example of transistor $INV_N$ of FIG. 5 and since its drain is connected to a switching node, then step 60 decreases $L_s$ with respect to the drain of transistor $INV_N$. In the preferred embodiment, the decrease is such that $L_s$ for the drain is returned to the minimum distance established under the design rules. However, note that step 60 does not affect the other source/drain of the transistor at issue. Thus, in the example of transistor $INV_N$ in FIG. 5, the source of that transistor retains the larger distance of $L_s$ as established in step 46, that is, at a value larger than the minimum specified by the design rules. To further demonstrate step 60, FIG. 6 illustrates a transistor $60_T$, designated as such to relate it to step 60 in method 40. Transistor $60_T$ shares many attributes with transistor $46_T$ illustrated in and discussed above relative to FIG. 4, although different reference identifiers are used in certain places to distinguish the differences between the two transistors. Looking to those differences, the source/drain $S/D_3$ retains the same distances $CTE_2$ and $CTG_2$ which, from step 46, are extended to give rise to a length $L_{s2}$ greater than the minimum set by the design rules. However, as a result of step 60, the source/drain $S/D_4$ has those distances reduced to the minimum set by those design rules, and since those shorter distances are in general as depicted in FIG. 1, then they are shown in FIG. 6 as $CTE_1$ and $CTG_1$ as also shown in FIG. 1 and also thereby defining a length $L_{s1}$ that is less than $L_{s2}$. Further, in applying FIG. 6 to the example of transistor $INV_N$ from FIG. 5, then source/drain $S/D_3$, having extended values $CTE_2$ and $CTG_2$, represents the non-switching source of transistor $INV_N$ while source/drain $S/D_4$, having minimum dimensions set by the design rules values $CTE_1$ and $CTG_1$, represents the switching drain of transistor $INV_N$.

Having demonstrated the asymmetry of transistor $60_T$ created by the adjustment of step 60, the benefit of such an adjustment is now explored. Specifically, it is noted that by increasing $L_s$ then the capacitance of the corresponding source/drain may increase. For a non-switching node, this increased capacitance may pose little operational effect. However, for a switching node, such as the drain of transistor $INV_N$, additional capacitance may slow the speed of the device. Of course, this aspect may be offset by the increased drive current capability achieved by increasing the sum, but step 60 represents a decision to forego that offset and instead choose the lower capacitance which results by implementing the minimum dimensions established by the design rules. In other words, while previously step 44 or 46 may have increased $L_s$ in view of current drive considerations, step 58 considers transistor performance to a greater extent in that in addition to having earlier considered drive current capability, step 58 considers the possibility of increased and undesirable capacitance. Still further, however, in an alternative embodiment, step 60 could be eliminated so as to favor the larger value of $L_s$ despite the increased capacitance, thereby providing the greater drive current capability; as yet another alternative still other criteria may be added for consideration as to whether the larger value of $L_s$ is worthwhile even in the case of a switching transistor node. Lastly, note in the preferred embodiment that the asymmetry created by step 60 is applied only to non-linear operating transistors; thus, for linear operating transistors (e.g., in an operational amplifier, phased lock loop, or still others), then they may be specified by other criteria to have a symmetrically enlarged value of $L_s$ thereby improving the drive current of such devices. Following step 60, method 40 continues to step 54.

Once step 54 is reached after step 60, then again step 54 operates as set forth above, that is, to determine whether the circuit being analyzed includes another NMOS transistor that has not been processed through the steps described above. Eventually given the preceding, therefore, all NMOS transistors in the circuit are analyzed, and quite likely method 40 will specify a design for some of those transistors to include a distance for the contact-to-edge, the contact-to-gate, or the distance $L_s$ that relates to one or both of those values, that is larger than the minimum set forth in the design rules, and these larger values may apply to one or both source/drains for the transistor. In other words, once step 56 is reached, method 40 will likely have defined various transistors, and the dimensions of these transistors will place them into at least two different sets. In a first set, each transistor in that first set will have minimum distances set by the design rules, that is, for the transistors identified by step 42 and not further changed in dimension by method 40, then they preferably will implement the minimum dimensions set by the design rules (although still other processes may adjust these dimensions as well). In a second set, however, each transistor in the second set will have a value of $L_s$ that is larger than the minimum set by the design rules, and the larger $L_s$ may apply to one or both source/drains of the transistor. In addition, the transistors with a larger $L_s$ value also may include values of $L_g$ and $W_g$ which are still according to the minimum design rules. In any event, for those NMOS transistors having larger $L_s$ values, they will provide increased drive current over the NMOS transistor using solely the minimums set forth in the design rules.

From the above, it may be appreciated that the above embodiments provide a method for identifying certain NMOS transistors and increasing the total distance $L_s$ which includes one or both the contact-to-edge distance and the contact-to-gate distance for one or both source/drains of those transistors. This total distance may be increased by increasing either the contact-to-edge distance, or the contact-to-gate distance, or both distances. In the preferred embodiment, the determination to increase $L_s$ is based on various criteria which are shown in decision blocks in method 40, and which therefore include: (1) whether a transistor is in a critical path of a circuit; (2) whether a transistor has an output node connected to two or more gates of other transistors; (3) whether the transistor is coupled to operate in a linear or non-linear range; and (4) whether a transistor has at least one source/drain connected to a switching potential. Criteria (1) and (2) have been shown to relate to a general consideration based on transistor drive current capability, while criteria (3) and (4) further take into account transistor performance by considering the effects of added capacitance that may arise by increasing $L_s$. Moreover, while the present embodiments have been described in detail and with various alternatives, various substitutions, modifications or alterations could be made to the descriptions set forth above without departing from the inventive scope. For example, while system 20 has been shown as a preferred system for implementing method 40, the method may be implemented in other manners and, indeed, may even represent a design methodology embodied only in part by a computer-assisted technique or indeed with no such assistance. As still another example, while the steps of method 40 are shown in a given sequence including those relating to the preferred criteria, various changes are contemplated such as a change in the order of those steps, the removal of one or more steps, and the addition of still other design steps. Indeed, by increasing the distances set forth above, the area of the corresponding transistor necessarily increases and, thus, still another criterion considered by method 40 could be a determination as to whether the increase in area is acceptable. For example, in some instances it may be desirable to reduce overall area, in which case some of the NMOS transistors having increased distances may be selected so that the distances of those transistors are reduced to the minimum design rules. As a final example, the preferred embodiment teaches increasing either or both of the contact-to-edge and contact-to-gate distances; thus, one skilled in the art may ascertain various techniques for choosing to increase only one of these two values, and such a person also may ascertain the amount the preferred increase. In any event, the many teachings set forth above should further illustrate the inventive scope, as is defined by the following claims.

What is claimed is:

1. A method of designing a circuit comprising a plurality of transistors, wherein each transistor of the plurality of transistors comprises an active region, a gate, a first source/drain in the active region, a second source/drain in the active region, and at least one contact in each of the first source/drain and the second source/drain; the method comprising the steps of:
    specifying a first set of distances for each transistor in a first set of transistors in the plurality of transistors, wherein the first set of distances comprises a gate length, a gate width, and a distance representative of one or both of a first contact-to-edge distance and a first contact-to-gate distance;
    specifying a second set of distances for each transistor in a second set of transistors in the plurality of transistors, wherein the second set of distances comprises a gate length, a gate width, and a distance representative of one or both of a second contact-to-edge distance and a second contact-to-gate distance;
    wherein either or both the second contact-to-edge distance is greater than the first contact-to-edge distance and the second contact-to-gate distance is greater than the first contact-to-gate distance; and
    wherein, for each transistor in the second set of transistors, the step of specifying a second set of distances is responsive to a determination of a benefit from a larger drive current to be provided by the transistor in the second set of transistors.

2. The method of claim 1 wherein the step of specifying a second set of distances for each transistor in a second set of transistors in the plurality of transistors is further responsive to whether the transistor in the second set is in a critical path of a circuit.

3. The method of claim 1 wherein the step of specifying a second set of distances for each transistor in a second set of transistors in the plurality of transistors is further responsive to whether the transistor in the second set has an output node connected to two or more gates of other transistors.

4. The method of claim 1 wherein the step of specifying a second set of distances for each transistor in a second set of transistors in the plurality of transistors is further responsive to whether the transistor in the second set has at least one source/drain connected to a switching potential.

5. The method of claim 1 wherein the step of specifying a second set of distances for each transistor in a second set of transistors in the plurality of transistors is further responsive to whether the transistor is coupled to operate in a linear or a non-linear range.

6. The method of claim 1 wherein the second contact-to-edge distance represented by the second set of distances applies to both the first source/drain and the second source/drain for one or more transistors in the second set of transistors.

7. The method of claim 1 wherein the second contact-to-gate distance represented by the second set of distances applies to both the first source/drain and the second source/drain for one or more transistors in the second set of transistors.

8. The method of claim 1:
    wherein the second contact-to-edge distance represented by the second set of distances applies to both the first source/drain and the second source/drain for one or more transistors in the second set of transistors; and
    wherein the second contact-to-gate distance represented by the second set of distances applies to both the first source/drain and the second source/drain for one or more transistors in the second set of transistors.

9. The method of claim 1:
    wherein, for one or more transistors in the second set of transistors, the second set of distances represents the second contact-to-edge distance to be applied to only the first source/drain of the one or more transistors;
    wherein the second contact-to-edge distance is greater than the first contact-to-edge distance; and
    wherein the second source/drain for the one or more transistors in the second set of transistors comprises a contact-to-edge distance that is less than the second contact-to-edge distance.

10. The method of claim 9 wherein the step of specifying a second set of distances for each transistor in a second set of transistors in the plurality of transistors is responsive to whether the transistor is coupled to operate in a linear or a non-linear range.

11. The method of claim 1:
    wherein, for one or more transistors in the second set of transistors, the second set of distances represents the second contact-to-gate distance to be applied to only the first source/drain of the one or more transistors;
    wherein the second contact-to-gate distance is greater than the first contact-to-gate distance; and
    wherein the second source/drain for the one or more transistors in the second set of transistors comprises a contact-to-gate distance that is less than the second contact-to-gate distance.

12. The method of claim 11 wherein the step of specifying a second set of distances for each transistor in a second set of transistors in the plurality of transistors is responsive to whether the transistor is coupled to operate in a linear or a non-linear range.

13. The method of claim 1 wherein the distance representative of one or both of a second contact-to-edge distance and a second contact-to-gate distance specifies a sum including the second contact-to-edge distance and the second contact-to-gate distance.

14. The method of claim 1 wherein each transistor in the second set of transistors is an n-type transistor.

15. A computer system, comprising:
processing circuitry;
storage circuitry for storing a plurality of files, the plurality of files comprising:
  a circuit description file comprising data describing devices and signals in a circuit, wherein the devices comprise a plurality of transistors and wherein each transistor of the plurality of transistors comprises an active region, a gate, a first source/drain in the active region, a second source/drain in the active region, and at least one contact in each of the first source/drain and the second source/drain;
  a program file;
wherein the processing circuitry is programmed in response to the program file to perform the steps of:
  specifying a first set of distances for each transistor in a first set of transistors in the plurality of transistors, wherein the first set of distances comprises a gate length, a gate width, and a distance representative of one or both of a first contact-to-edge distance and a first contact-to-gate distance; and
  specifying a second set of distances for each transistor in a second set of transistors in the plurality of transistors, wherein the second set of distances comprises a gate length, a gate width, and a distance representative of one or both of a second contact-to-edge distance and a second contact-to-gate distance;
wherein for each transistor in the second set of transistors, either or both the second contact-to-edge distance is greater than the first contact-to-edge distance and is specified in response to a determination of a benefit from a larger drive current to be provided by the transistor in the second set of transistors.

16. The system of claim 15 wherein the step of specifying a second set of distances for each transistor in a second set of transistors in the plurality of transistors is responsive to whether the transistor in the second set is in a critical path of a circuit.

17. The system of claim 15 wherein the step of specifying a second set of distances for each transistor in a second set of transistors in the plurality of transistors is responsive to whether the transistor in the second set has an output node connected to two or more gates of other transistors.

18. The system of claim 15 wherein the step of specifying a second set of distances for each transistor in a second set of transistors in the plurality of transistors is responsive to whether the transistor in the second set has at least one source/drain connected to a switching potential.

19. The system of claim 15 wherein the step of specifying a second set of distances for each transistor in a second set of transistors in the plurality of transistors is responsive to whether the transistor is coupled to operate in a linear or a non-linear range.

20. The system of claim 15 wherein each transistor in the second set of transistors is an n-type transistor.

21. The system of claim 15 wherein the second contact-to-edge distance represented by the second set of distances applies to both the first source/drain and the second source/drain for one or more transistors in the second set of transistors.

22. The system of claim 15 wherein the second contact-to-gate distance represented by the second set of distances applies to both the first source/drain and the second source/drain for one or more transistors in the second set of transistors.

23. The system of claim 15:
wherein the second contact-to-edge distance represented by the second set of distances applies to both the first source/drain and the second source/drain for one or more transistors in the second set of transistors; and
wherein the second contact-to-gate distance represented by the second set of distances applies to both the first source/drain and the second source/drain for one or more transistors in the second set of transistors.

24. The system of claim 15:
wherein, for one or more transistors in the second set of transistors, the second set of distances represents the second contact-to-edge distance to be applied to only the first source/drain of the one or more transistors;
wherein the second contact-to-edge distance is greater than the first contact-to-edge distance; and
wherein the second source/drain for the one or more transistors in the second set of transistors comprises a contact-to-edge distance that is less than the second contact-to-edge distance.

25. The system of claim 24 wherein the step of specifying a second set of distances for each transistor in a second set of transistors in the plurality of transistors is responsive to whether the transistor is coupled to operate in a linear or a non-linear range.

26. The system of claim 15:
wherein, for one or more transistors in the second set of transistors, the second set of distances represents the second contact-to-gate distance to be applied to only the first source/drain of the one or more transistors;
wherein the second contact-to-gate distance is greater than the first contact-to-gate distance; and
wherein the second source/drain for the one or more transistors in the second set of transistors comprises a contact-to-gate distance that is less than the second contact-to-gate distance.

27. The system of claim 26 wherein the step of specifying a second set of distances for each transistor in a second set of transistors in the plurality of transistors is responsive to whether the transistor is coupled to operate in a linear or a non-linear range.

28. The system of claim 15 wherein the distance representative of one or both of a second contact-to-edge distance and a second contact-to-gate distance specifies a sum including the second contact-to-edge distance and the second contact-to-gate distance.

* * * * *